United States Patent [19]

Riaz et al.

[11] Patent Number: 5,385,751

[45] Date of Patent: * Jan. 31, 1995

[54] ATMOSPHERIC PRESSURE CVD PROCESS FOR PREPARING FLUORINE-DOPED TUNGSTEN OXIDE FILMS

[75] Inventors: Umar Riaz, Ann Arbor; James W. Proscia, Dearborn, both of Mich.

[73] Assignee: Ford Motor Company, Dearborn, Mich.

[*] Notice: The portion of the term of this patent subsequent to Feb. 15, 2011 has been disclaimed.

[21] Appl. No.: 86,800

[22] Filed: Jul. 6, 1993

[51] Int. Cl.$^6$ .................. B05D 5/12; C23C 16/40
[52] U.S. Cl. ................ 427/126.2; 427/126.3; 427/166; 427/255.2; 427/255.3
[58] Field of Search ............... 427/255, 255.2, 255.3, 427/166, 126.2; 65/60.5, 60.53

[56] References Cited

U.S. PATENT DOCUMENTS

| | | | |
|---|---|---|---|
| 3,216,845 | 11/1965 | Brown | 427/166 |
| 4,500,567 | 2/1985 | Kato et al. | 427/255.3 |
| 4,601,917 | 7/1986 | Russo et al. | 427/109 |
| 4,626,448 | 12/1986 | Hays | 427/39 |
| 4,721,632 | 1/1988 | Brown | 427/255.2 |
| 5,004,490 | 4/1991 | Brown | 427/166 |
| 5,034,246 | 7/1991 | Mance et al. | 427/126.3 |
| 5,085,805 | 2/1992 | Ruf | 65/60.5 |
| 5,102,691 | 4/1992 | Russo et al. | 427/109 |
| 5,124,180 | 6/1992 | Proscia | 427/255.3 |
| 5,126,921 | 6/1992 | Fujishima et al. | 361/525 |

OTHER PUBLICATIONS

American Nuclear Society Proceedings—The Third International Conference on CVD, 1972, pp. 215–241.

*Primary Examiner*—Shrive Beck
*Assistant Examiner*—Brian K. Tallot
*Attorney, Agent, or Firm*—Lorraine S. Melotik; Roger L. May

[57] ABSTRACT

A film of fluorine-doped tungsten oxide is provided on a substrate by reacting together tungsten alkoxide, an oxygen-containing compound, and a fluorine-containing compound.

19 Claims, No Drawings

ATMOSPHERIC PRESSURE CVD PROCESS FOR PREPARING FLUORINE-DOPED TUNGSTEN OXIDE FILMS

FIELD OF THE INVENTION

This invention relates generally to the preparation of fluorine-doped tungsten oxide films on a substrate from the reaction of a tungsten alkoxide, an oxygen containing compound and a fluorine-containing compound at an elevated temperature.

BACKGROUND OF THE INVENTION

It is well-known in the glass art to coat glass sheets with metallic and/or dielectric materials to impart enhanced solar and optical properties to the glass sheets. For example, it is known to place multiple layers of metals and dielectrics onto glass to produce electrically conductive coatings which are transparent to visible light and yet highly reflective to infrared radiation. It is also known to deposit conductive metal oxides onto glass, such as fluorine-doped tin oxide, which are also highly reflective to infrared radiation.

Tungsten oxide is a transparent semi-conductor, which when doped with fluorine shows an appreciable increase in its infrared absorption and reflection. Hence, fluorine-doped tungsten oxide films are potential candidates as coatings on glass for solar control applications. By reflecting and/or absorbing energy in the infrared, these coatings when applied to glass reduce the energy influx into a building or motor vehicle by as much as 50 percent, thereby reducing the need for air-conditioning systems.

Many techniques for depositing metal and dielectric coatings onto glass are well-known. Examples of conventional deposition techniques include liquid or powder spray pyrolysis, wherein liquids or solid particles containing film forming reactants are sprayed onto the surface of a hot glass ribbon being produced by the well-known float glass process. A more convenient method for depositing coatings onto glass is by way of chemical vapor deposition, wherein vaporized film-forming precursors are reacted at or near the surface of a hot glass ribbon to form the metal or dielectric film thereon. Chemical vapor deposition does not suffer from the problems associated with either liquid or powder spray pyrolysis techniques. That is, the liquid spray pyrolysis technique substantially cools the hot glass ribbon, while the powder spray pyrolysis technique requires a complex, delicate powder handling and delivery system.

One method for producing fluorine-doped tungsten oxide films on glass is disclosed in U.S. application Ser. No. 806,177, now U.S. Pat. No. 5,286,520 filed Dec. 13, 1991 to Proscia and commonly assigned with the present invention. It discloses a process for forming a coating on glass by reacting at the surface of the glass at elevated temperatures, tungsten hexafluoride, an oxygen containing compound, and a fluorine-containing compound such as difluoroethane. The disadvantage of that process is that it produces corrosive hydrogen fluoride as a by-product. It would be desirable to prepare a fluorine-doped tungsten oxide film by a process which overcomes the above deficiency.

SUMMARY OF THE INVENTION

According to the present invention, a process is disclosed for providing a film of fluorine-doped tungsten oxide on a substrate by reacting together a tungsten alkoxide, an oxygen containing compound, and a fluorine-containing compound near the surface of the substrate at a temperature and for a time sufficient to form a film of fluorine-doped tungsten oxide on the substrate.

DETAILED DESCRIPTION OF THE PREFERRED EMBODIMENT

The invention is directed to a process for providing a film of fluorine-doped tungsten oxide on a substrate as disclosed above. More particularly, the invention process provides blue-colored, infrared reflecting, electrically conducting films of fluorine-doped tungsten oxide on the surface of a substrate, preferably by means of a chemical vapor deposition technique (CVD).

Advantageously, the inventive process may be used to coat substrates, e.g., glass sheets, to prepare blue tinted, infrared reflecting and/or absorbing automotive and architectural glazings. The substrate may however be other materials like quartz which would benefit from a modification of their infrared absorption/reflective properties through the application of such a film.

The first reactant for use according to the present invention is a tungsten alkoxide. Exemplary of such alkoxides are such alkoxides are tungsten (V) ethoxide, $W(OC_2H_5)_5$; tungsten (VI) ethoxide, $W(OC_2H_5)_6$; tungsten (V) phenoxide; tungsten (VI) phenoxide; tungsten (V) isopropoxide; and tungsten (VI) isopropoxide. Mixtures of such alkoxides may also be used in this invention. Still other tungsten alkoxides useful in this invention would be apparent to those skilled in the art in view of the present disclosure. Particularly preferred tungsten alkoxides are tungsten (V) ethoxide and tungsten (VI) ethoxide.

The second reactant used in the process of the present invention is an oxygen-containing compound. Contemplated equivalent oxygen-containing compounds having the same operability and utility include, but are not necessarily limited to, alcohols e.g., isopropyl alcohol, t-butyl alcohol, methanol, ethanol, n-propanol, isobutyl alcohol, cyclohexanol, allyl alcohol, benzyl alcohol, etc., oxygen, water, and the like, as well as mixtures thereof. Preferably, the oxygen-containing compound is selected from oxygen gas, ethyl alcohol, isopropyl alcohol, t-butyl alcohol, and mixtures thereof.

The third reactant according to the present invention is a fluorine-containing compound. Contemplated equivalent fluorine-containing compounds having the same operability and utility include, but are not necessarily limited to, 1,1-difluoroethane, 1,1,1-chlorodifluoroethane, 1,1-difluoroethylene, chlorotrifluoroethylene, carbonyl fluoride, sulfur hexafluoride, nitrogen trifluoride, trifluoroacetic acid, bromotrifluoromethane, trifluoroacetic anhydride, ethyl trifluoroacetoacetate, trifluoroethanol, ethyl trifluoroacetate, pentafluoropropionic acid, heptafluorobutyryle chloride, 1,1,1-trifluoroacetylacetone, Freons, 2-chloro-1,1,2-trifluoroethylmethyl ether, chlorodifluoroacetic acid, difluoroacetic acid, ethyl chlorofluoroacetate, methyl trifluoroacetate, ethyl-4,4,4-trifluoroacetoacetate, hydrofluoric acid, and the like, as well as mixtures and derivatives thereof. A preferred fluorine-containing compound is 1,1-difluoroethane.

The concentrations of reactants for use in the process of the present invention may vary over wide limits. Generally, the molar ratio of tungsten alkoxide to oxygen-containing compound is from about 2:1 to about 1:5. Preferably, the molar ratio is from about 1:1 to about 1:3. The fluorine-containing compound is generally present in an amount from about 1% to about 50% by weight of the total reaction mixture. Preferably, the concentration is from about 5% to about 30% by weight of the reaction mixture.

The tungsten alkoxide, oxygen-containing compound, and fluorine-containing compound are reacted together at an elevated temperature and for a time sufficient to result in the formation of a fluorine-doped tungsten oxide film on the substrate. The time required for the reaction to occur is not sharply critical, and is usually in the range of up to several seconds. Fluorine-doped tungsten oxide may be deposited onto the substrate by, e.g., the well-known atmospheric pressure chemical vapor deposition method. The reaction temperature is preferably between about 300° C. to 500° C. Conveniently, when the film is being applied to a flat glass, it can be applied to a hot glass ribbon being produced by the well-known float glass process at its annealing temperatures from about 400° C. to about 425° C. That is, the three reactants may be vaporized and conveyed to the surface of the hot glass ribbon where the inventive reaction occurs as a result of the heat retained by the glass ribbon. The vapors pyrolyrically decompose and combine to form fluorine-doped tungsten oxide which deposits on the glass substrate. The resultant coated glass may be used to manufacture blue-tinted, electrically conductive, infrared reflecting and/or absorbing automotive and architectural glazings.

The glass upon which fluorine-doped tungsten oxide is deposited in a preferred embodiment of the present invention may be any of the types of glass generally known in the art of glass making. Particularly useful is soda-lime-silica glass, produced by the well-known float glass process. Other glasses include, without limitation, borosilicate glass, boroaluminosilicate glass, alkali-lime-silica glass, aluminosilicate glass, phosphate glass, fused silica, and the like.

The reactants may each, individually be prepared by any conventional procedure known to be useful for generating vaporized reactants such as, for example, the thermal vaporization of a liquid reactant, the vaporization of a dispersed or fluidized reactant powder in a hot inert carrier gas stream, the bubbling of an inert carrier gas through a liquid reactant, etc. Inert carrier gases include, but are not necessarily limited to, helium, nitrogen, hydrogen, argon, and the like, as well as mixtures thereof.

Example 1

In this example, films of fluorine-doped tungsten oxide are deposited according to an embodiment of the present invention by means of an atmospheric pressure laminar flow cylindrical quartz reactor. The reactor is heated in a Lindberg Mini-Mite Model 55035 tube furnace.

Tungsten (V) ethoxide is loaded into a stainless steel bubbler and heated with heating tape to a temperature of 130 ° C. Purified nitrogen is used as the carrier gas to transport the tungsten (V) ethoxide from the bubbler to the reactor. The tubes leading to the reactor are also heated via heating tape. The reactants are introduced to the reactor through an injector consisting of two concentric tubes. The inner tube is used to transport the tungsten (V) ethoxide while the outer tube is used to transport difluoroethane diluted with nitrogen and the oxygen containing compound, air. The substrate is placed on the stainless steel susceptor and the temperature of the furnace is assumed to be the temperature of the substrate.

Film deposition is carried out on a glass substrate at a temperature of 350 ° C. A flow rate of 100 cc/min is used to transport the tungsten (V) ethoxide and the difluoroethane. The nitrogen diluting the difluoroethane is flowed in at 200 cc/min and air at 500 cc/min. The gases flow over the substrate for 5 minutes. The result is a blue fluorine-doped tungsten oxide coating on the glass.

Example 2

The procedure of example 1 is followed to deposit a film according to an embodiment of the present invention except that the tungsten (V) ethoxide is replaced by tungsten (VI) ethoxide. The result is a blue fluorine-doped tungsten oxide coating on the glass.

Example 3

The procedure of example 1 is followed to deposit a film according to an embodiment of the present invention except that the air is replaced by a 10% ethanol in nitrogen mixture as the oxygen-containing compound. The result is a blue fluorine-doped tungsten oxide coating on the glass.

Example 4

The procedure of example 1 except that the tungsten (V) ethoxide is replaced by tungsten (VI) isopropoxide. The result is a blue fluorine-doped tungsten oxide coating on the glass.

From the foregoing description, one skilled in the art can easily ascertain the essential-characteristics of the present invention, and without departing from the spirit and scope thereof, can make various changes and modifications to the invention to adapt it to various usages and conditions.

We claim:

1. A process for providing fluorine-doped tungsten oxide on the surface of a substrate, which process comprises reacting together a tungsten alkoxide, an oxygen-containing compound, and a fluorine-containing compound at the surface of the substrate at a temperature and for a time sufficient to form a film of fluorine-doped tungsten oxide on the substrate.

2. The process according to claim 1, wherein the tungsten alkoxide is selected from the group consisting of tungsten V ethoxide and tungsten VI ethoxide.

3. The process according to claim 1, wherein the oxygen-containing compound is oxygen gas.

4. The process according to claim 3, wherein the oxygen gas is mixed with another oxygen-containing compound selected from the group consisting of isopropyl alcohol, ethyl alcohol and t-butyl alcohol.

5. The process according to claim 1, wherein the fluorine-containing compound is 1,1-difluoroethane.

6. The process according to claim 1, wherein the temperature is from about 300° C. to about 500° C.

7. The process according to claim 1, wherein the molar ratio of tungsten alkoxide to oxygen-containing compound is from about 2:1 to about 1:5.

8. The process according to claim 1, wherein the fluorine-containing compound comprises from about 1% to about 50% by weight of the reaction mixture.

9. The process according to claim 1, wherein the tungsten alkoxide is selected from the group consisting of tungsten V ethoxide and tungsten VI ethoxide; the oxygen-containing compound is selected from the group consisting of oxygen, isopropyl alcohol, ethyl alcohol, and t-butyl alcohol, and mixtures thereof; and the fluorine-containing compound is 1,1-difluoroethane, the molar ratio of tungsten alkoxide to oxygen-containing compound being from about 2:1 to about 1:3 the 1,1-difluoroethane being from about 5% to about 30% by weight of the reaction mixture, and the temperature is from about 300° C. to about 500° C.

10. The process according to claim 1, wherein the substrate is glass.

11. A process for coating glass, comprising the steps of:

A) providing a glass substrate, having a surface; and
B) reacting at the surface of the substrate tungsten alkoxide, an oxygen-containing compound, and a fluorine-containing compound, at a temperature and for a time sufficient to form a layer of fluorine-doped tungsten oxide on the surface of the glass substrate.

12. A process according to claim 11, wherein said tungsten alkoxide is selected from tungsten V ethoxide and tungsten VI ethoxide.

13. A process for coating glass according to claim 11, wherein the oxygen-containing compound is selected from the group consisting of oxygen, isopropyl alcohol and t-butyl alcohol, and mixtures thereof.

14. The process for coating glass according to claim 11, wherein the fluorine-containing compound is 1,1-difluoroethane.

15. The process for coating glass according to claim 11, wherein the temperature is from about 300° C. to about 500° C.

16. The process for coating glass according to claim 11, wherein the molar ratio of tungsten alkoxide to oxygen-containing compound is from about 2:1 to about 1:5.

17. The process for coating glass according to claim 11, wherein the fluorine-containing compound comprises from about 1% to about 50% by weight of the reaction mixture.

18. A process for preparing a blue tinted, electrically conductive, infrared radiation reflecting coated glazing for automotive or architectural use, comprising the steps of:

A) providing a glass substrate, having a surface; and
B) reacting at the surface of the substrate tungsten alkoxide selected from the group consisting of tungsten V ethoxide or tungsten VI ethoxide; an oxygen-containing compound selected from the group consisting of oxygen, isopropyl alcohol, ethyl alcohol, and t-butyl alcohol, and mixtures thereof; and 1,1-difluoroethane; the molar ratio of tungsten alkoxide to oxygen-containing compound being from about 1:1 to about 1:3, the 1,1-difluoroethane being from about 5% to about 30% by weight of the reaction mixture, at a temperature from about 300° C. to about 500° C. and for a time sufficient to form a layer of fluorine-doped tungsten oxide on the surface of the glass substrate.

19. A process for incorporating fluorine atoms into tungsten oxide, as the tungsten oxide is being formed by a reaction between tungsten alkoxide and an oxygen-containing compound, comprising reacting with the tungsten alkoxide and the oxygen-containing compound a fluorine-containing compound selected from the group consisting of 1,1-difluoroethane, 1,1,1-chlorodifluoroethane, 1,1-difluoroethylene, chlorotrifluoroethylene, carbonyl fluoride, sulfur hexafluoride, nitrogen trifluoride, trifluoroacetic acid, bromotrifluoromethane, trifluoroacetic anhydride, ethyl trifluoroacetoacetate, trifluoroethanol, ethyl trifluoroacetate, pentafluoropropionic acid, heptafluorobutyryle chloride, 1,1,1-trifluoroacetylacetone, Freon, 2-chloro-1,1,2-trifluoroethylmethyl ether, chlorodifluoroacetic acid, difluoroacetic acid, ethyl chlorofluoroacetate, methyl trifluoroacetate, ethyl-4,4,4-trifluoroacetoacetate, hydrofluoric acid, as well as mixtures and derivatives thereof, to form fluorine-doped tungsten oxide.

* * * * *